United States Patent [19]

Thomas

[11] 4,320,360
[45] Mar. 16, 1982

[54] CURRENT PULSE-INJECTED, PHASE-LOCKED OSCILLATOR

[75] Inventor: Robert M. Thomas, Renton, Wash.
[73] Assignee: Hazeltine Corporation, Greenlawn, N.Y.
[21] Appl. No.: 115,638
[22] Filed: Jan. 28, 1980
[51] Int. Cl.³ .............................................. H03L 7/24
[52] U.S. Cl. ................................. 331/172; 331/177 R
[58] Field of Search ....................... 331/1 R, 9, 10, 16, 331/18, 20, 145, 149, 153, 172, 173, 177 R, 177 V, 14

[56] References Cited

U.S. PATENT DOCUMENTS 3,210,691 10/1965 Sprott ............................ 331/172 X
3,278,862 10/1966 Danzer ........................... 331/173 X
3,534,285 10/1970 Kobold et al. .................... 331/18 X

OTHER PUBLICATIONS

Gardner, Floyd M., "Phaselock Techniques," John Wiley & Sons, Copyright 1979, pp. 79 and 90.
P. K. Runge, "Phase-Locked Loops with Signal Injection for Increased Pull-In Range and Reduced Output Phase Jitter", IEEE Transactions, pp. 636-644, Jun. 1976.

*Primary Examiner*—Siegfried H. Grimm
*Attorney, Agent, or Firm*—E. A. Onders; F. R. Agovino

[57] ABSTRACT

The phase of a voltage controlled oscillator (VCO) can be controlled and changed by a series of pulses applied through an isolating element such as a capacitor. A small amount of current injected into the reactive element distorts the waveform of the VCO during the period of injection. Depending on the power of the pulse of injected current, a corresponding phase shift in the output of the VCO will result during the period of injection. The pulses are applied at a frequency equivalent to the desired frequency. Assuming the waveform of the VCO to be sinusoidal or otherwise symmetrical, the injected current pulses result in one point on the waveform where the distortion will be symmetrical and stable. The injection of repeated pulses results in this stable point eventually occurring symmetrically about the peak of the VCO waveform thereby locking the phase of the VCO to correspond to the frequency of the injected pulses.

12 Claims, 7 Drawing Figures

CURRENT PULSE-INJECTED, PHASE-LOCKED OSCILLATOR

BACKGROUND OF THE INVENTION

1. Field of the Invention

The invention generally relates to phase locking techniques and, in particular, relates to a phase-locked, voltage-controlled oscillator.

2. Background of the Prior Art

FIGS. 1 and 2 illustrate, in schematic form, the prior art techniques employed for phase locking and frequency changing of a voltage-controlled oscillator. FIG. 1 particularly illustrates the phase locking system as employed in the prior art. In general, the voltage-controlled oscillator 6 is phase locked to the oscillator 1 by the following sequence. If the frequency of the voltage-controlled oscillator 6 is significantly greater or significantly smaller than the frequency of the oscillator 1 (more than 1%), the discriminator 5 applies an output signal to the voltage-controlled oscillator in the form of a voltage proportional in amplitude, and corresponding in sign to the difference in the frequencies of the voltage-controlled oscillator 6 and the oscillator 1. This output signal is used to drive the voltage-controlled oscillator 6 nearer to the frequency of oscillator 1. As the frequency of the voltage-controlled oscillator 6 approaches the frequency of oscillator 1, the output of discriminator 5 approaches zero. When the frequency of the voltage-controlled oscillator 6 and the oscillator 1 are very close (usually less than 1%), the phase comparator 2 becomes dominant within the circuit to control the frequency of the voltage-controlled oscillator 6. The phase comparator 2 has inputs 3 and 4 from the reference oscillator 1 and voltage-controlled oscillator 6, respectively, and operates to determine the phase difference between these oscillators. The output of the phase comparator is applied to a low-pass filter 8 which applies a direct current component of the output of the phase comparator 2 to a direct current amplifier 7 for application to the voltage-controlled oscillator 6. This amplified direct current component will drive and hold the voltage-controlled oscillator 6 in phase lock with oscillator 1.

FIG. 2 particularly illustrates the prior art technique used for frequency control of the voltage-controlled oscillator 16. The frequency of the voltage-controlled oscillator 16 is changed by varying the direct current control voltage from D.C. control 18. This control voltage is applied to a reactive element such as variable reactance 17 to change the frequency of the VCO 16 by changing the resonant frequency of tank circuit 13. One such reactive element frequently employed in the prior art is a Varicap. The output from the variable reactance 17 is applied through isolating capacitor 19 to VCO 16 comprising a tuned circuit including D.C. amplifier 11 having a feedback circuit 12 and tuned tank circuit 13 with inductance 14 and capacitance 15. D.C. is equivalent to slowly varying A.C. in this regard.

SUMMARY OF THE INVENTION

It is an object of this invention to provide an improved phase-locked oscillator having a high degree of oscillator control, including a high pull-in frequency.

It is another object of this invention to provide a phase locking circuit for a voltage-controlled oscillator having fewer hardware components as compared to the prior art circuits.

It is yet another object of this invention to provide a phase locking circuit for a voltage-controlled oscillator which does not require a separate discriminator, direct current amplifier, low-pass filter and phase comparator to achieve phase locking.

It is yet another object of this invention to provide a phase locked, voltage-controlled oscillator which has a particularly fast acquisition time.

It is another object of this invention to describe a phase locking circuit for a voltage-controlled oscillator having the ability to vary the phase of the voltage-controlled oscillator at digital logic speeds.

The phase locking circuit according to the invention is particularly applicable to a voltage-controlled oscillator such as a tuned circuit connected to a feedback amplifier utilizing, in a preferred embodiment, a sinusoidal waveform. An isolating means applies an input signal to the voltage-controlled oscillator. It is particularly contemplated that the isolating means comprise a reactance such as a capacitor, although there are other devices such as a diode which function in this regard. Phase locking is accomplished by a current injection means for selectively applying a current pulse through the isolating means as the input signal for the voltage-controlled oscillator. The current pulse causes a phase shift in the oscillating output signal of the voltage-controlled oscillator. This results in a stable distortion eventually occurring symmetrically about a peak of the oscillating output signal. The result is that the voltage-controlled oscillator is in phase lock with a series of pulses applied from the current injection means. In a preferred embodiment, the current injection means comprises a pulse generating means and a voltage-controlled oscillator comprising a tuned feedback amplifier, such as a tuned circuit connected to a feedback amplifier, is employed. It is further contemplated that, once the voltage-controlled oscillator is phase locked with the series of current pulses, a means may be provided for decreasing the amplitude of the current pulse thereby decreasing the distortion of the waveform. Simultaneously, a means is provided for supplying a voltage to the voltage-controlled oscillator through the isolating means, which maintains the voltage-controlled oscillator in phase lock.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Figure 1:
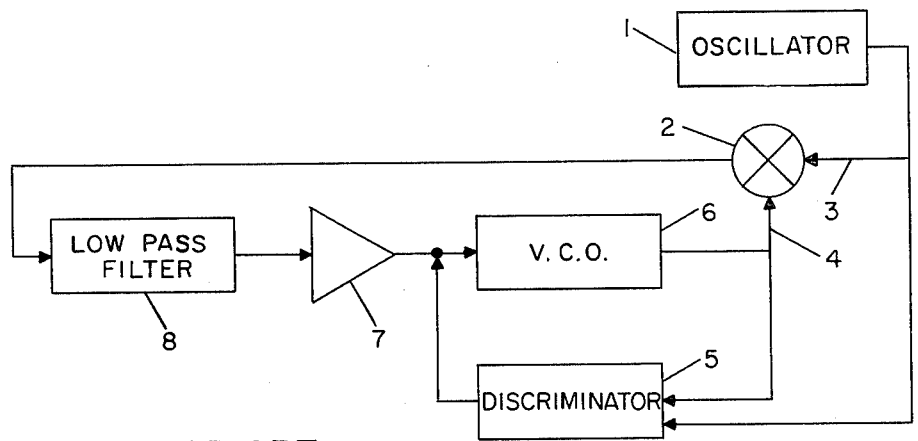
FIG. 1 is a schematic diagram of a prior art circuit employed for phase locking a voltage-controlled oscillator.
Figure 2:
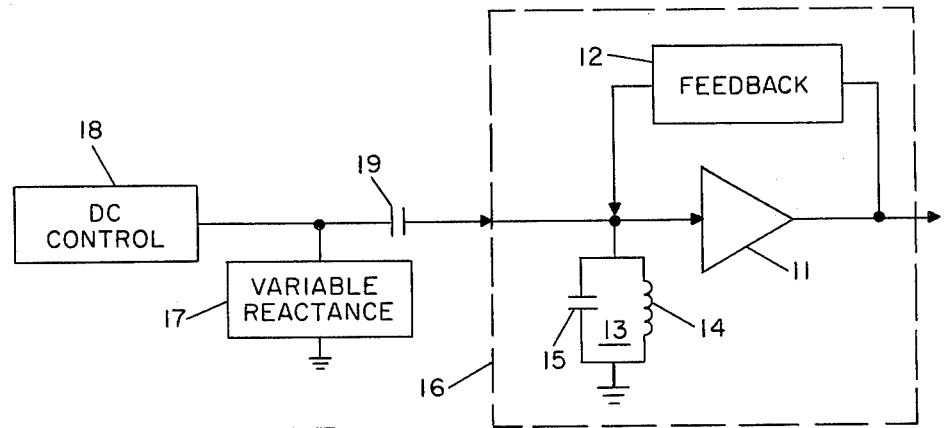
FIG. 2 is a schematic diagram of a prior art circuit used for controlling the frequency of a voltage-controlled oscillator.
Figure 3:
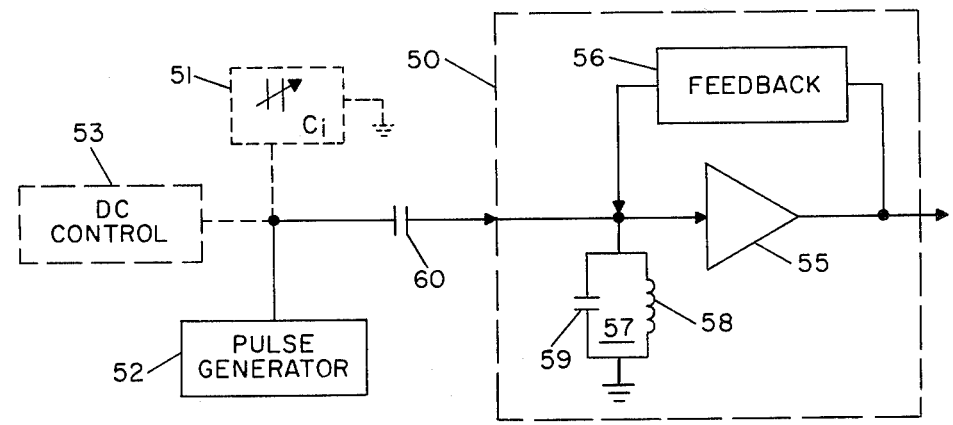
FIG. 3 is a schematic diagram of the phase locking circuit for a voltage-controlled oscillator according to the invention.

FIG. 3 schematically illustrates the current injecting technique contemplated by the invention. In general, a voltage-controlled oscillator (VCO) 50 is in the form of a tuned feedback circuit. In a preferred embodiment, it is contemplated that VCO 50 comprise a direct current amplifier 55 having a feedback circuit 56 interconnecting its input and output. The feedback circuit 56 is controlled by a tuned tank circuit 57 having inductance 58 in parallel with a capacitance 59. An important feature of the invention is current injection means 52, in the form of a pulse generator, for selectively applying a current pulse to the input of the control means 51. The current pulse selectively distorts the waveform of VCO 50 thereby producing a phase shift in the output of the VCO. An isolating capacitor 60 may be employed to isolate the current injection means 52.

Figure 4A:
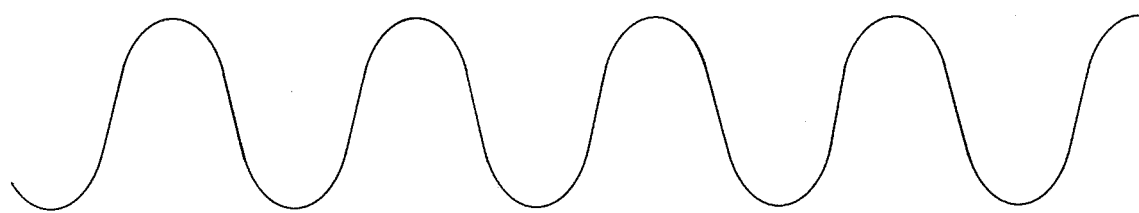
FIGS. 4A, 4B and 4C are graphic illustrations of signals in the circuit of FIG. 3.

The phase shift is the result of a change in the waveform of VCO 50 during the time of application of the current pulse. This change in the waveform can best be understood by referring to FIGS. 4A–4C. FIG. 4A illustrates the tuned circuit voltage waveform of VCO 50 in the uncontrolled state. FIG. 4A is a free running waveform which is not phase locked.

Figure 4B:
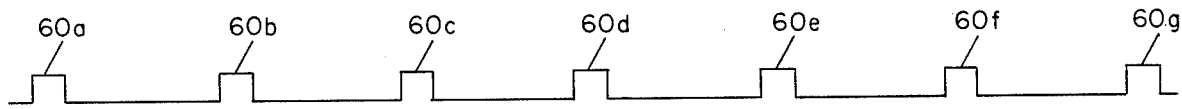
Figure 4C:
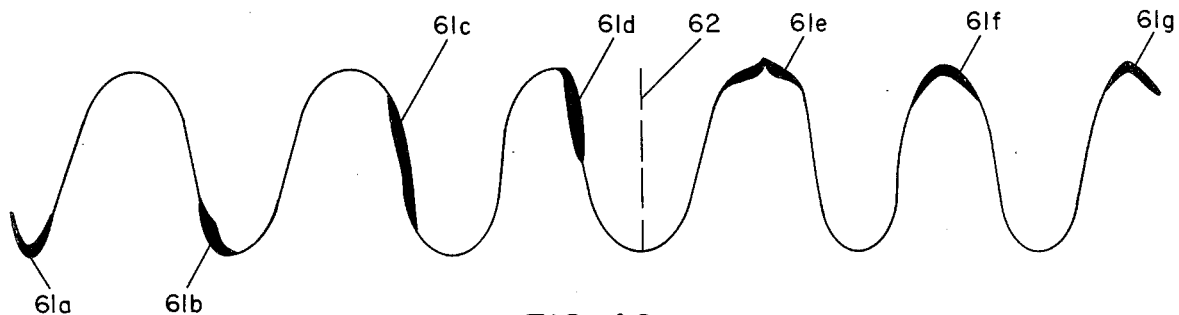

FIG. 4B illustrates the current injection means 52 output, wherein a plurality of pulses 60, corresponding in frequency to the phase desired, are applied to the VCO 50. FIG. 4C illustrates the waveform of the output of VCO 50. The waveform to the left of line 62 shows the waveform when current pulses 60 have been injected by current injection means 52 but the phase of VCO 50 is not yet locked. The waveform to the right of line 62 illustrates the output of VCO 50 when in phase lock with the pulses 60 illustrated in FIG. 4B. Comparing the waveforms of FIGS. 4A, 4B and 4C, it can be appreciated that the free-running waveform of FIG. 4A is initially 180° out of phase with the pulses 60. Initial pulse 60a causes an initial distortion 61a within the waveform of the output signal of the VCO. This distortion tends to cause a phase shift in the waveform so that the subsequent distortion 61b, as a result of pulse 60b, occurs approximately 150° out of phase. As pulses are continually applied, the phase difference between the pulses 60 and the phase of the VCO decreases until the distortion reaches the apex of the VCO output waveform. The result is that the distortion caused by pulse 60e, 60f, 60g, etc., occurs at the peaks as indicated by 61e, 61f and 61g. Since this distortion is symmetrically located about the peak of the waveform, the first half of the distortion balances the second half of the distortion so that the waveform of the output of the VCO is in phase lock with the series of current pulses.

The reason for this balancing is that the injected current pulses 60 are of the same polarity as the sine wave of the output waveform of the VCO. Although a point 180° away from the peak of the waveform may appear to be another locking point, this 180° point is unstable. Theoretically, if the current injected pulse 60 is perfectly centered at this 180° point and no noise exists, a stable locking may result. However, in practical application it is impossible to perfectly center the current pulse at this 180° point and it is also impossible to create a noiseless voltage-controlled oscillator output. The result is that the distortion tends to creep up the waveform until reaching and centering on the apex. Because the polarity of the pulse is the same as the polarity of the waveform, the distortion at the bottom of the sine wave is significant whereas the distortion at the top of the sine wave is of diminishing importance, in comparison. Generally, the distinction can be likened to positive and negative feedback. An injected pulse occurring at the bottom of the waveform is similar to negative feedback and, if not perfectly centered and without noise, tends to move up along the waveform toward the peak. In contrast, an injected pulse occurring at the peak of the waveform is equivalent to positive feedback and naturally locates symmetrically about the peak so that the first half of the distortion counterbalances the second half of the distortion.

If the output waveform of the VCO 50 were of particular concern, it is contemplated that the pulses could gradually be removed after phase lock is achieved and a D.C. control means 53 with frequency control means 51 could apply a D.C. voltage to maintain the phase lock. This may be accomplished by any means which would gradually decrease the amplitude of the pulse 60 applied by pulse generator 52 to control means 51. Without intending to limit the foregoing, examples of such a means are a variable resistance in series between the generator 52 and control means 51, and a variable power supply controlling the generator 52. Alternatively, the output of D.C. control 53 may be applied along with or in place of the current pulses. The D.C. control 53 would apply a direct current voltage or a very low frequency alternating current voltage as compared to the frequency of VCO 50 as the VCO reaches phase lock.

The degree of control of the phase locking of the VCO 50 is a function of the duration and amplitude (power) of the injected current pulse 60. In a preferred embodiment, it is contemplated that the duration of the pulse must be limited to 330° and the amplitude of the pulse must be limited by the electrical capabilities of the components in the circuit.

Figure 5:
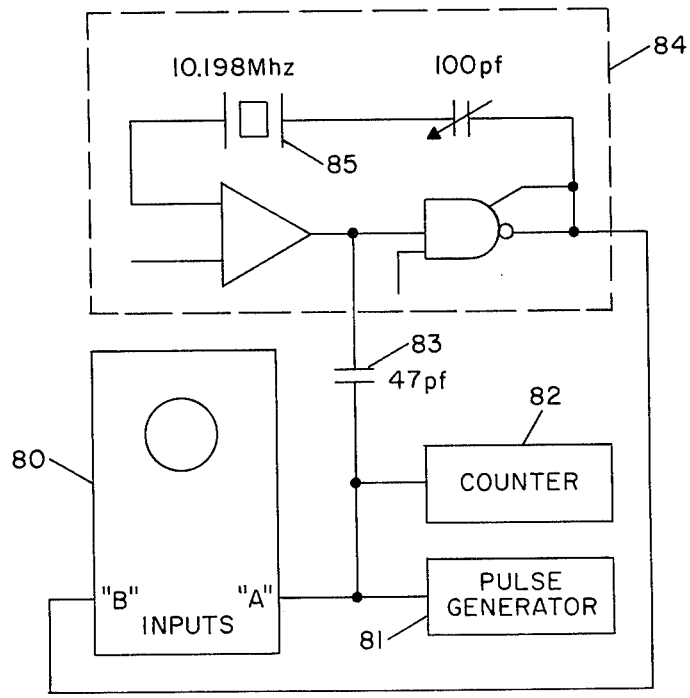
FIG. 5 is a schematic diagram of a test circuit employing the phase locking circuit for a voltage-controlled oscillator according to the invention.

FIG. 5 illustrates a test circuit employed to demonstrate the acquisition and pull-in capabilities of a digital class "C" crystal oscillator phase locked according to the technique of the invention. Pulse generator 81 was connected through counter 82 and 47 pf. isolating capacitor 83 to a tuned circuit 84 including a variable 100 pf. isolating capacitor and a digital chip such as ½ ua 9615 Fairchild Line Rec. The output of tuned circuit 84 was applied to a 10.198 Mhz oscillating crystal 85. The dual-trace oscilloscope 80 showed that phase lock was achieved at 7.52278, 10.2000 and 16.3764 Mhz. In addition, the frequency was manually swept from 7.52278 Mhz to 16.3764 Mhz and continuous phase locking was observed on the oscilloscope 80.

The phase locking circuit according to the invention is particularly useful where fast acquisition time is an important feature. In addition, the invention may be employed in an analog circuit to sweep an oscillator through a wide range of frequencies where the waveform is not of particular concern.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

I claim:

1. A phase-locked oscillator comprising:

(a) voltage-controlled oscillator means for generating an output signal having a distorted symmetrical, nonsquare waveform with a distorted apex whose frequency and phase may be controlled in response to an input signal; and (b) means for selectively, exclusively applying a series of current pulses, having a predetermined frequency, to the voltage-controlled oscillator means as the input signal whereby the voltage-controlled oscillator means is caused to be phase-locked to the series of current pulses.

2. The phase-locked oscillator of claim 1 further comprising means for isolating said means for selectively applying.

3. The phase-locked oscillator of claim 1 wherein said means for selectively applying comprises a pulse generating means.

4. The phase-locked oscillator of claims 1 or 3 wherein said voltage-controlled oscillator means comprises a tuned feedback amplifier.

5. The phase-locked oscillator of claim 4 wherein said amplifier comprises a tuned circuit connected to a feedback amplifier.

6. The phase-locked oscillator of claims 1 or 3 further including means for decreasing the amplitude of the current pulses after the voltage-controlled oscillator means is phase-locked to the series of current pulses.

7. The phase-locked oscillator of claim 6 further including means for supplying a voltage to the voltage-controlled oscillator means as the input signal after the voltage-controlled oscillator means is phase-locked to the series of current pulses.

8. The phase-locked oscillator of claim 1 further including means for supplying a voltage to the voltage-controlled oscillator means as the input signal after the voltage-controlled oscillator means is phase-locked to the series of current pulses.

9. The phase-locked oscillator of claim 1 further including means for supplying a voltage to the voltage-controlled oscillator means as the input signal.

10. The phase-locked oscillator of claim 9 further comprising control means for supplying the voltage to the voltage-controlled oscillator means.

11. The phase-locked oscillator of claim 10 wherein said control means comprises a reactance.

12. The phase-locked oscillator of claim 11 wherein said reactance comprises a capacitor.

* * * * *